(12) United States Patent
Yeh et al.

(10) Patent No.: US 6,455,913 B2
(45) Date of Patent: *Sep. 24, 2002

(54) COPPER FUSE FOR INTEGRATED CIRCUIT

(75) Inventors: Wen-Kuan Yeh, Chupei; Chih-Yung Lin, Taichung Hsien, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/495,625

(22) Filed: Jan. 31, 2000

(51) Int. Cl.⁷ ............................................... H01L 29/00
(52) U.S. Cl. ........................ 257/529; 257/209; 257/530; 438/132; 438/467
(58) Field of Search ................................. 257/529, 762, 257/752, 763, 209; 438/132, 215, 281, 333, 467, 601, 128, 129; 29/612, 613, 623; 337/290, 292, 295, 297

(56) References Cited

U.S. PATENT DOCUMENTS

| | | | | |
|---|---|---|---|---|
| 5,731,624 A | * | 3/1998 | Motsiff et al. | 257/529 |
| 5,962,910 A | * | 10/1999 | Hawley et al. | 257/530 |
| 6,144,096 A | * | 11/2000 | Lopatin | 257/751 |
| 6,175,145 B1 | * | 1/2001 | Lee et al. | 257/529 |

* cited by examiner

Primary Examiner—Steven Loke
Assistant Examiner—Donghee Kang
(74) Attorney, Agent, or Firm—J.C. Patents

(57) ABSTRACT

A copper fuse structure for integrated circuit employs two copper pads formed over a semiconductor substrate. The two copper pads are electrically insulated by dielectrics. An aluminum line is utilized to cover and electrically connect the two copper pads.

7 Claims, 1 Drawing Sheet

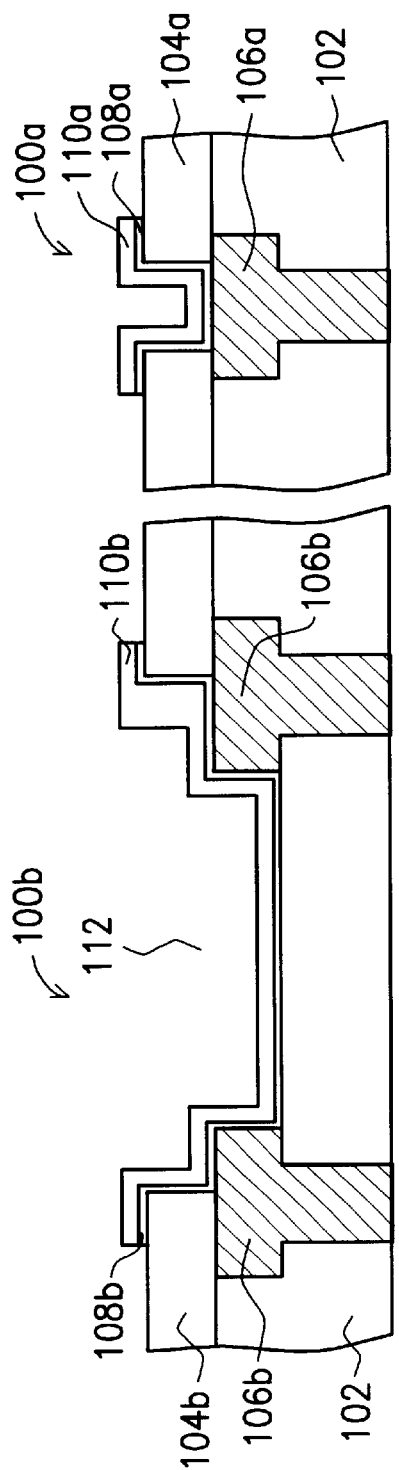
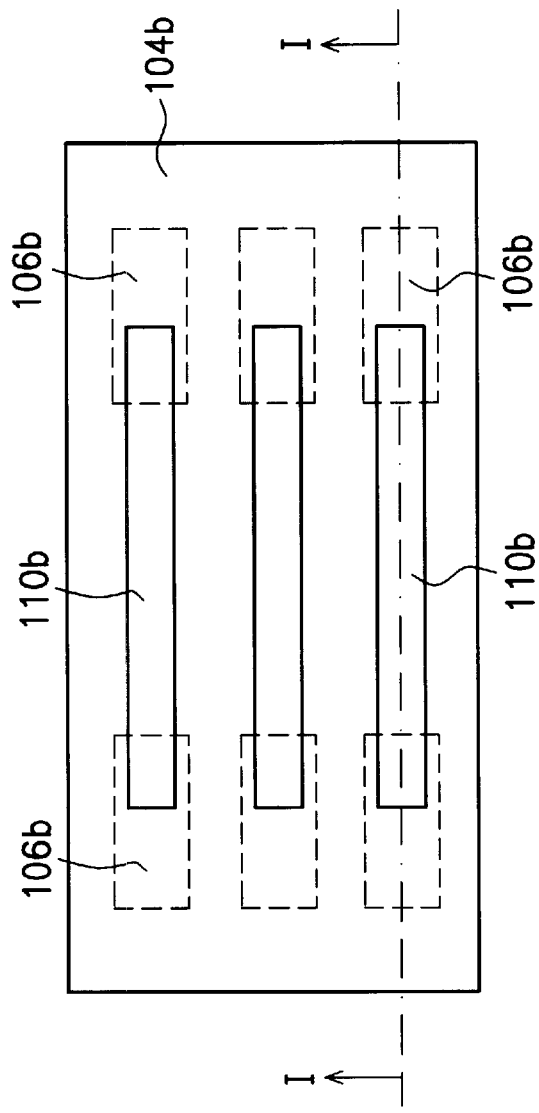

COPPER FUSE FOR INTEGRATED CIRCUIT

BACKGROUND OF THE INVENTION

1. Field of Invention

The present invention relates to a semiconductor structure in integrated circuit (IC). More particularly, the present invention relates to a copper fuse of semiconductor structure for IC.

2. Description of Related Art

As the design rule of the semiconductor process approaches or is less than 0.18 μm, copper gradually replaces aluminum as an interconnect in the metallization process since copper has lower resistance that can reduce RC delay. However, copper easily reacts with the oxygen in the surroundings to form a thin copper oxide on its surface, which leads to the failure of electrical contact. As a result, it is difficult to substitute copper for aluminum when forming a fuse in an IC as, in the IC industry, at the current line width.

SUMMARY OF THE INVENTION

The invention provides a structure of a copper fuse in an IC, by which structure RC delay is reduced.

As embodied and broadly described herein, the invention provides a structure of a copper fuse for an IC, which fuse includes two copper pads formed on a semiconductor substrate where the copper pads are isolated from each other with dielectrics. A metal line formed over the semiconductor substrate covers the two metal pads wherein one end of the metal line is connected to one of the two copper pads and the other end of the metal line is connected to the other of the two copper pads. A passivation layer formed over the semiconductor substrate covers the two copper pads.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 is a schematic, cross-sectional view illustrating a structure of a copper fuse according to one preferred embodiment of this invention; and FIG. 2 is a schematic, top view of FIG. 1, where the cross-sectional view along the line I—I is shown in FIG. 1.

DESCRIPTION OF THE PREFERRED EMBODIMENTS

Referring to FIG. 1, after the formation of a MOS device and contact (not shown), a tungsten plug is subsequently formed in the device region 100a of an IC structure. Such metallization processes as wiring line and vias are carried out by damascene, for example, where the wiring lines and the vias are isolated from with dielectrics 102. Thereafter, a passivation layer 104a is deposited and then patterned by photolithography to form a pad window such that a metal pad 106a made of copper, for example, is exposed. A barrier layer 108a such as TiN or TaN is formed on the metal pad layer 106a. An aluminum layer 110a is formed and patterned to complete the wire bonding process of the device region 100a for the back-end process of the IC.

Referring to FIG. 1 and FIG. 2 simultaneously, a copper fuse set up in the peripheral region 100b is first to form two metal copper pads 106b in the dielectrics 102. The two copper pads 106b connected to corresponding devices (not shown) are formed by damascene, for example, when the metal pad 106a is formed. Thereafter, the passivation layer 104b is formed when the passivation layer 104a is formed in order to cover the two copper pads 106b. The passivation layer 104b can be silicon oxide/silicon nitride, for example. As the passivation layer 104a in the device region 100a is patterned, photolithography is also employed to form an opening 112 in the passivation layer 104b so that the two copper pads are exposed. A barrier layer 108b such as TiN or TaN formed by sputtering is then formed on the copper pads 106b. A metal layer 110b is formed by sputtering to cover the copper pads 106b to electrically connect the two copper pads 106b. The barrier layer 108b is used to improve the adhesion of the copper pads 106b and the metal layer 110b, and the metal layer 110b can be aluminum, for example. Thereafter, the metal layer 110b and the barrier layer 108b are patterned to form parallel fuses, as shown in FIG. 2. One end of the metal layer 110b is connected to one copper pad 106b and the other end of the metal layer 1106b is connected to the other copper pad 106b.

The two copper pads 106b and the metal line 110b constitute the copper fuse structure of the preferred embodiment in the invention. The copper pads 106b are electrically insulated and electrically connected by the metal layer 110b. Therefore, when any one of the fuses in FIG. 2 must be disconnected, the metal line 110b can be blown off by laser power such that the copper pads 106b can be prevented from being damaged.

The copper pads 106b in this embodiment is covered by the passivation layer 104b and the metal layer 110b so that the copper pads 106b are isolated from the air. When the back end process is complete, the copper pads 106b are not exposed. Therefore, oxidation on the surface of the copper pads 104b can be avoided. In addition, the copper pads are used as a portion of the fuses, thereby reducing RC delay.

Moreover, the process to form the copper fuses in this embodiment is compatible with the back-end process of the device region 100a for IC structure. Thus, the manufacturing cost does not increase.

The copper fuse structure utilizes an aluminum metal line to cover and electrically connect to the two copper pads. The copper pads serve as a part of the fuses to reduce RC delay, and in addition, the fuse is disconnected by blowing off the aluminum line. Moreover, the aluminum line and the passivation layer covering the copper pads is capable of preventing the copper pads from being oxidized by air.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A copper fuse for an integrated circuit, comprising:
   at least two copper pads, located on a semiconductor substrate;
   a patterned passivation layer formed over the substrate for covering a portion of the copper pads, wherein the remaining portion of the copper pads is exposed;

a conformal metal line disposed over the patterned passivation layer and the exposed portion of the copper pads, one end being electrically connected to one of the two copper pads and the other end being electrically connected to the other of the two copped pads; and a conformal barrier layer located between the metal line and two copper pads, wherein the conformal barrier layer covering a portion of the patterned passivation layer and the exposed portion of the copper pads;

wherein at least the two copper pads and the metal line are used as a fuse.

2. The copper fuse according to claim 1, wherein the metal line includes aluminum.

3. The copper fuse according to claim 1, wherein the barrier layer includes TaN.

4. The copper fuse according to claim 1, further including a passivation layer covering the two copper pads.

5. A copper fuse for integrated circuit, comprising:

two copper pads, formed on a semiconductor substrate, the two copper pads are insulated with a dielectric;

a conformal metal line having a first end and a second end, formed on the semiconductor substrate, covering portions of the two copper pads wherein the first end is connected to one of the two copper pads and the second end is connected to the other of the two copper pads;

a passivation layer, formed on the semiconductor substrate and covering remaining portions of the two copper pads; and a conformal barrier layer located between the metal line and the two copper pads, wherein the conformal barrier layer covering the passivation layer and the copper pads;

wherein the two copper pads and the metal line are used as a fuse.

6. The copper fuse according to claim 5, wherein the metal line includes aluminum.

7. The copper fuse according to claim 5, wherein the barrier layer includes TaN.

* * * * *